United States Patent
Chang et al.

(10) Patent No.: US 8,581,339 B2
(45) Date of Patent: Nov. 12, 2013

(54) STRUCTURE OF NPN-BJT FOR IMPROVING PUNCH THROUGH BETWEEN COLLECTOR AND EMITTER

(75) Inventors: Chin-Wei Chang, Kaohsiung (TW); Ching-Lin Chan, Huwei Township, Yunlin County (TW); Chin-Shien Lu, Taipei (TW); Ming-Tung Lee, Taoyuan County (TW); Shuo-Lun Tu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 29 days.

(21) Appl. No.: 13/204,780

(22) Filed: Aug. 8, 2011

(65) Prior Publication Data

US 2013/0037914 A1     Feb. 14, 2013

(51) Int. Cl.
    *H01L 29/76*          (2006.01)
    *H01L 29/739*       (2006.01)

(52) U.S. Cl.
    USPC ........... 257/335; 257/139; 257/141; 257/412; 257/556; 257/E21.382; 257/E21.696; 257/E27.017; 257/E27.029; 438/309; 438/358

(58) Field of Classification Search
    USPC .......... 257/139, 141, 335, 412, 556, E21.382, 257/E21.696, E27.017, E27.029; 438/309, 438/358
See application file for complete search history.

(56) References Cited

U.S. PATENT DOCUMENTS

| | | | |
|---|---|---|---|
| 5,501,991 A | | 3/1996 | Jang |
| 5,648,281 A | * | 7/1997 | Williams et al. ............... 438/358 |
| 6,177,325 B1 | | 1/2001 | Jang |
| 7,755,168 B2 | * | 7/2010 | Terashima et al. ............. 257/587 |
| 7,944,022 B2 | * | 5/2011 | Ikuta et al. ..................... 257/556 |
| 2007/0108517 A1 | * | 5/2007 | Wu et al. ........................ 257/335 |
| 2010/0213507 A1 | * | 8/2010 | Ko et al. ......................... 257/141 |
| 2010/0327315 A1 | * | 12/2010 | Shirakawa et al. ............ 257/139 |
| 2013/0153956 A1 | * | 6/2013 | Shi et al. ........................ 257/140 |

FOREIGN PATENT DOCUMENTS

| | | |
|---|---|---|
| TW | 257883 | 9/1995 |
| TW | 484177 | 4/2002 |
| TW | 200847330 | 12/2008 |

OTHER PUBLICATIONS

English language translation of abstract of TW 257883 (published Sep. 21, 1995).
English language translation of abstract of TW 484177 (published Apr. 21, 2002).
English language translation of abstract of TW 200847330 (published Dec. 1, 2008).

* cited by examiner

*Primary Examiner* — Dao H Nguyen
(74) *Attorney, Agent, or Firm* — McClure, Qualey & Rodack, LLP

(57) ABSTRACT

A bipolar junction transistor and a manufacturing method for the same are provided. The bipolar junction transistor includes a well region, an emitter electrode, a base electrode, a collector electrode, and a conductive layer. The emitter electrode, the base electrode and the collector electrode are separated from each other by the well region. The conductive layer is on the well region between the base electrode and the collector electrode.

16 Claims, 5 Drawing Sheets

STRUCTURE OF NPN-BJT FOR IMPROVING PUNCH THROUGH BETWEEN COLLECTOR AND EMITTER

BACKGROUND

1. Technical Field

The disclosure relates in general to a semiconductor structure and a manufacturing method for the same, and more particularly to a bipolar junction transistor and a manufacturing method for the same.

2. Description of the Related Art

In semiconductor technology, a bipolar junction transistor (BJT) is a three-terminal electronic device constructed of doped semiconductor material. Bipolar transistors are so named because their operation involves both electrons and holes. Charge flow in a bipolar junction transistor is due to bidirectional diffusion of charge carriers across a junction between two regions of different charge concentrations. Bipolar junction transistors may be used in amplifying or switching applications.

SUMMARY

A bipolar junction transistor is provided. The bipolar junction transistor comprises a well region, an emitter electrode, a base electrode, a collector electrode, and a conductive layer. The emitter electrode, the base electrode and the collector electrode are separated from each other by the well region. The conductive layer is on the well region between the base electrode and the collector electrode.

A manufacturing method for a bipolar junction transistor is provided. The method comprises following steps. A conductive layer is formed on a well region. An emitter electrode, a base electrode and a collector electrode are formed in the well region and are separated from each other by the well region. The conductive layer is on the well region between the base electrode and the collector electrode.

DETAILED DESCRIPTION

Figure 1:
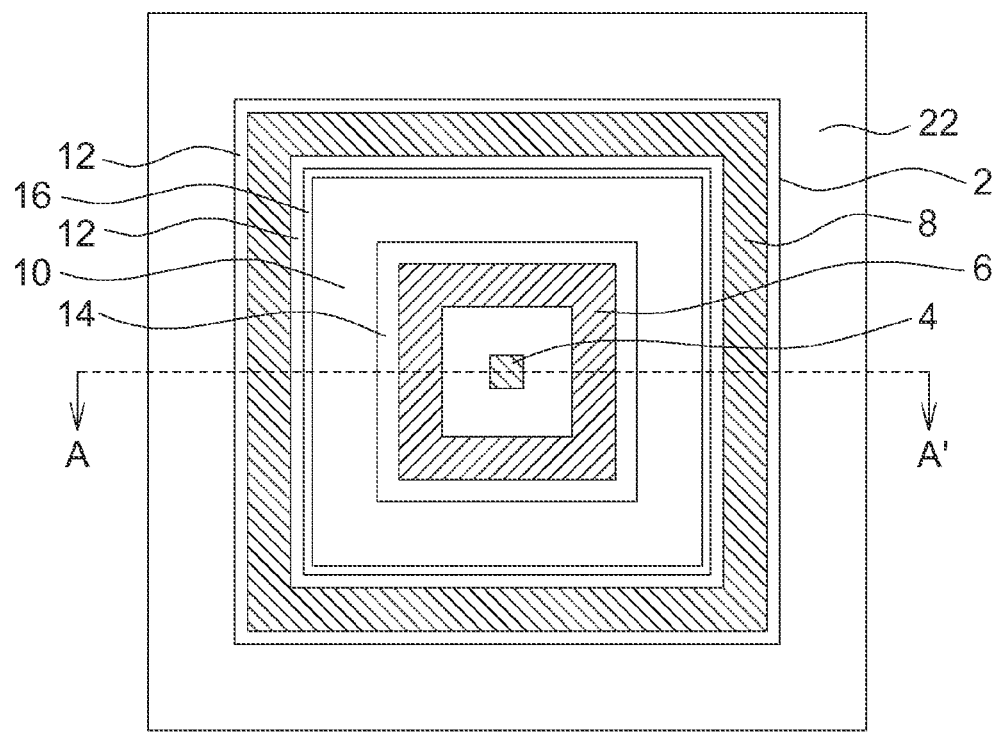
FIG. 1 illustrates a top view of a bipolar junction transistor in one embodiment.
Figure 2:
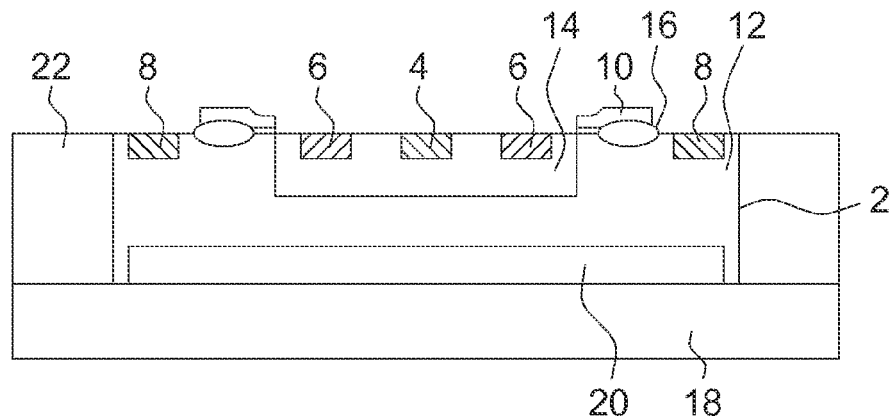
FIG. 2 illustrates a cross-section view of a bipolar junction transistor in one embodiment.

FIG. 1 illustrates a top view of a bipolar junction transistor (BJT) in one embodiment. FIG. 2 illustrates a cross-section view of the bipolar junction transistor drawn along AA' line in FIG. 1. Referring to FIG. 2, the bipolar junction transistor comprises a well region 2, an emitter electrode 4, a base electrode 6, a collector electrode 8 and a conductive layer 10. The well region 2 comprises a first well portion 12 and a second well portion 14 adjacent to each other. The emitter electrode 4, the base electrode 6 and the collector electrode 8 are separated from each other by the well region 2. The collector electrode 8 is in the first well portion 12. The emitter electrode 4 and the base electrode 6 are in the second well portion 14. The collector electrode 8 and the first well portion 12 may form a collector region. The base electrode 6 and the second well portion 14 may form a base region.

In embodiments, a distance between the emitter electrode 4 and the collector electrode 8 (or the collector region can be optimized for preventing lateral punch through.

The conductive layer 10 is on the first well portion 12 between the base electrode 6 and the collector electrode 8. In some embodiments, the conductive layer 10 is extended onto the second well portion 14. The dielectric structure 16 is between the conductive layer 10 and the well region 2. The conductive layer 10 may comprise a doped polysilicon, a metal silicide or a metal. The conductive layer 10 may be used as a field plate, changing electric field distribution, so as to increase breakdown voltage of the bipolar junction transistor.

Referring to FIG. 2, the bipolar junction transistor may comprise a substrate 18 and a buried layer 20. The first well portion 12 is between the second well portion 14 and the buried layer 20. The buried layer 20 is between the substrate 18 and the first well portion 12. Using the buried layer 20 can prevent vertical punch through. The bipolar junction transistor may comprise a doped region 22.

In one embodiment, the emitter electrode 4, the collector electrode 8, the first well portion 12 and the buried layer 20 have a first type conductivity such as N type conductivity. The base electrode 6, the second well portion 14, the substrate 18 and the doped region 22 have a second type conductivity, such us P type conductivity, opposite to the first type conductivity. In this case, the bipolar junction transistor is a NPN-BJT. However, the present disclosure is not limited thereto. In other embodiments, the bipolar junction transistor is a PNP-BJT having electric characteristic opposite to the NPN-BJT.

Figure 3:
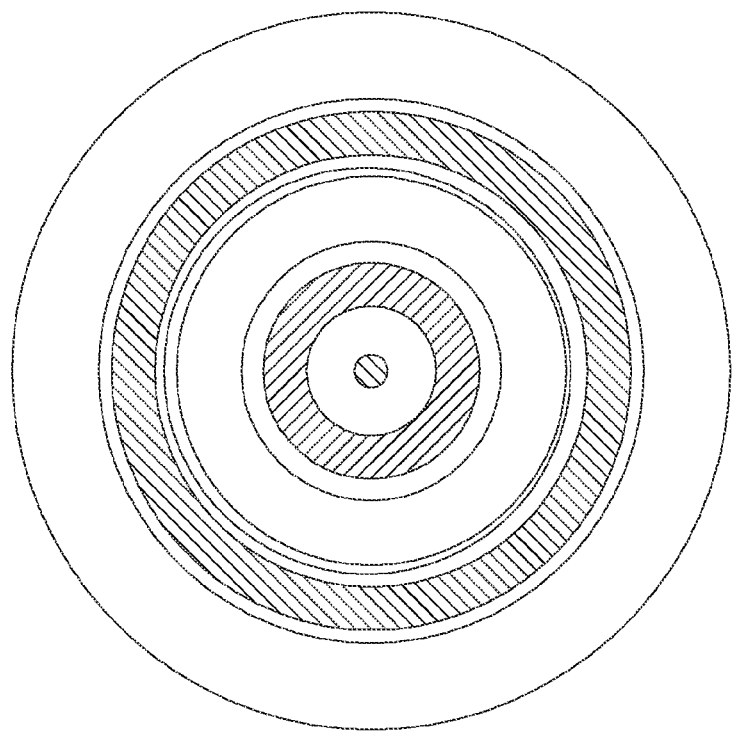
FIG. 3 illustrates a top view of a bipolar junction transistor in one embodiment.

The bipolar junction transistor is not limited to a rectangular profile as shown in FIG. 1. The bipolar junction transistor may have other suitable profiles such as a circular profile as shown in FIG. 3.

Figure 4:
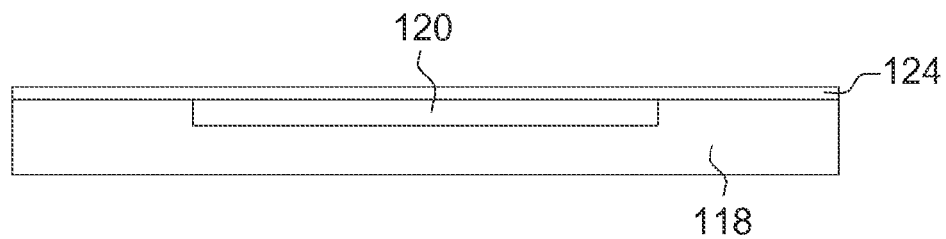
FIGS. 4-7 illustrate a manufacturing method for a bipolar junction transistor in one embodiment.

FIGS. 4-7 illustrate a manufacturing method for the bipolar junction transistor in one embodiment. Referring to FIG. 4, the buried layer 120 is formed in the substrate 118. The substrate 118 may comprise silicon. The buried layer 120 may be formed by a doping method. A doped layer 124 may be formed on the buried layer 120 by a doping step. The doped layer 124 may have the second type conductivity such as P type conductivity.

Figure 5:
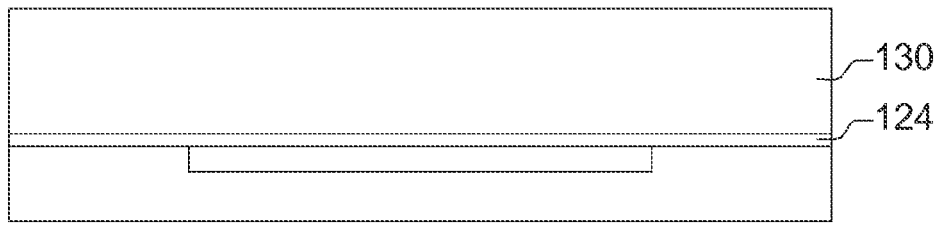
Figure 6:
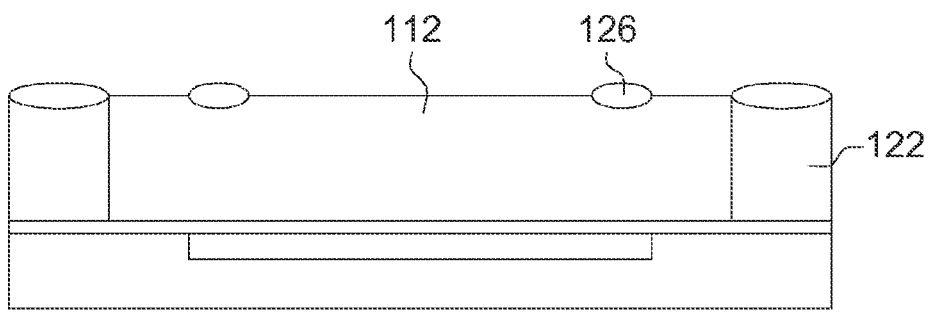

Referring to FIG. 5, an epitaxial layer 130 is formed on the doped layer 124. The epitaxial layer 130 may have the second type conductivity such as P type conductivity. The first well portion 112 and the doped region 122 as shown in FIG. 6 may be formed in the epitaxial layer 130 by a doping method. A dielectric element 126 may be formed on the first well portion 112 and the doped region 122. The dielectric element 126 may comprise a FOX as shown in FIG. 6. A range of the FOX may be defined by using a patterned hard mask comprising nitride, for example. However, the present disclosure is not limited thereto. In other embodiments, the dielectric element 126 may comprise a STI.

Figure 7:
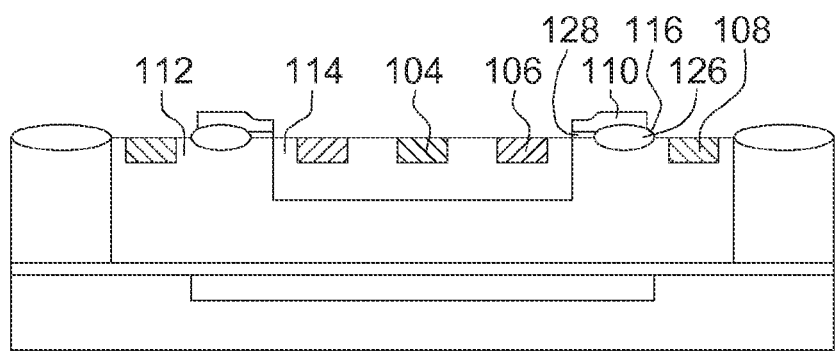

Referring to FIG. 7, a dielectric layer 128 is formed on the first well portion 112. The dielectric layer 128 may be formed by a thermal oxidation method. The dielectric element 126 and the dielectric layer 128 may form the dielectric structure 116. The conductive layer 110 is formed on the dielectric structure 116.

The second well portion 114 is formed in the first well portion 112. The emitter electrode 104 and the base electrode 106 are formed in the second well portion 114. The collector electrode 108 is formed in the first well portion 112. For example, the emitter electrode 104 and the collector electrode 108, both having the first type conductivity such as N type conductivity, are formed at the same time. In one embodiment, the emitter electrode 104, the base electrode 106 and the collector electrode 108 are heavily doped for providing ohm contact.

The doped elements or the epitaxial elements disclosed in the present disclosure can be varied properly. For example, the epitaxial layer, such as the epitaxial layer 130 in FIG. 5, may be replaced by the doped element formed by doping a material layer.

A size of the each element of the bipolar junction transistor can be determined according to the design. In one embodiment, the bipolar junction transistor may be followed by a STD process for forming other devices such as a CMOS or a DMOS. In embodiments, the bipolar junction transistor can be formed by using Bipolar-CMOS-DMOS (BCD) process, and therefore the bipolar junction transistor can be manufactured with other devices such as a MOS, a resistor, etc. at the same time. It helps to integrate various devices into a single chip and increase integration of a circuit. In addition, the cost and the processes for manufacture are reduced. For example, a static switch in a power electronic converter can be formed by using the BCD technology.

Figure 8:
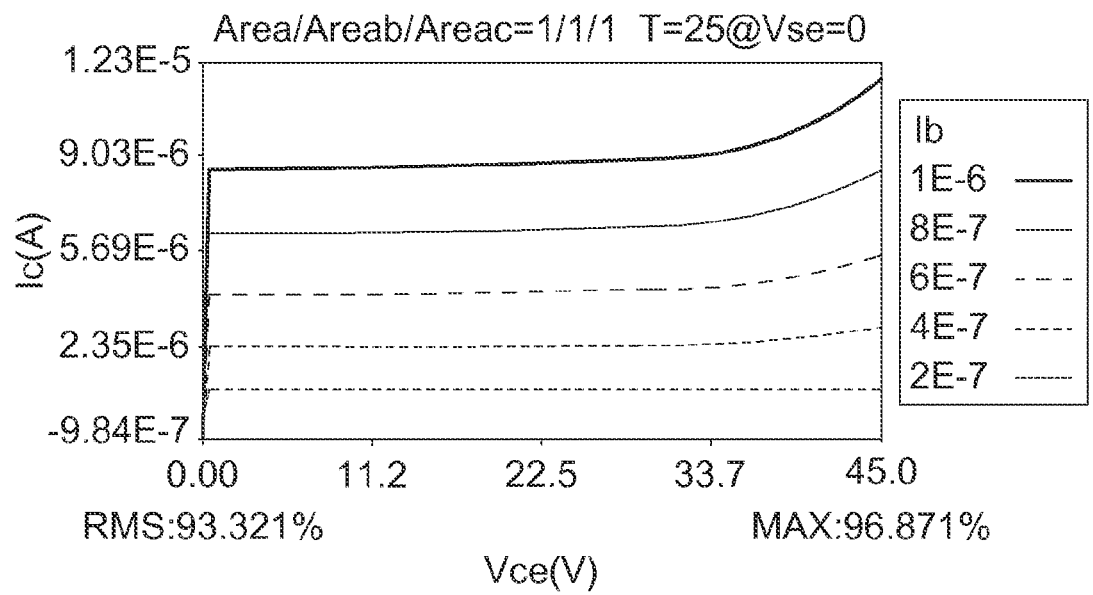
FIG. 8 shows curves of current of collector electrode-voltage of collector electrode to emitter electrode (Ic-Vice) of the bipolar junction transistor with the conductive layer.
Figure 9:
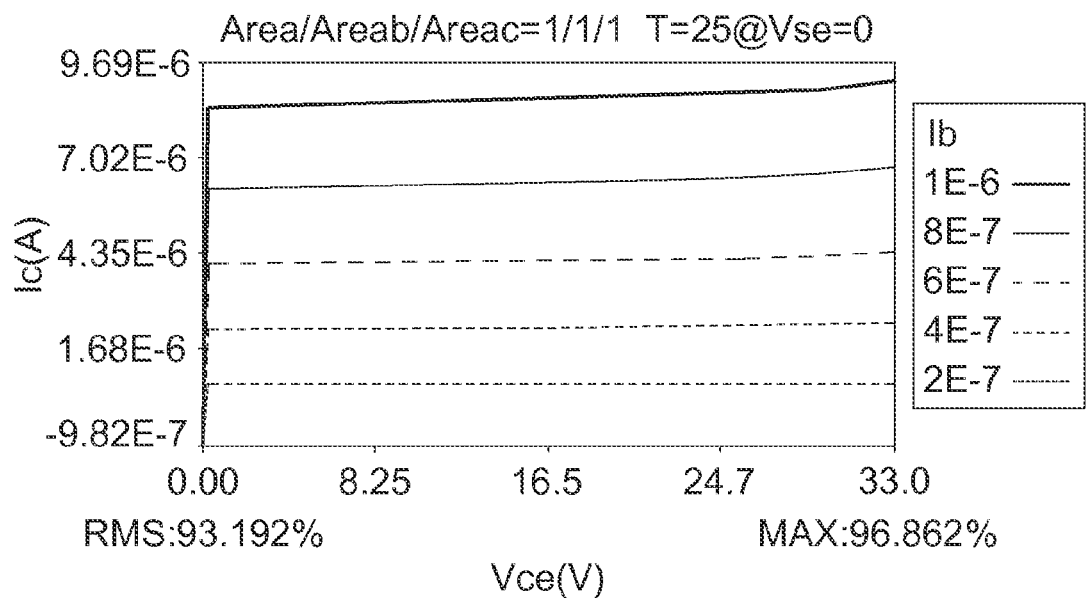
FIG. 9 shows Ic-Vice curves of the bipolar junction transistor without the conductive layer.

FIG. 8 and FIG. 9 respectively show curves of current of collector electrode-voltage of collector electrode to emitter electrode (Ic-Vice) of the bipolar junction transistor with and without the conductive layer. From the results, it is found that the maximum operation voltage (45V) for the bipolar junction transistor with the conductive layer (FIG. 8) is bigger than the maximum operation voltage (33V) for the bipolar junction transistor without the conductive layer (FIG. 9).

Figure 10:
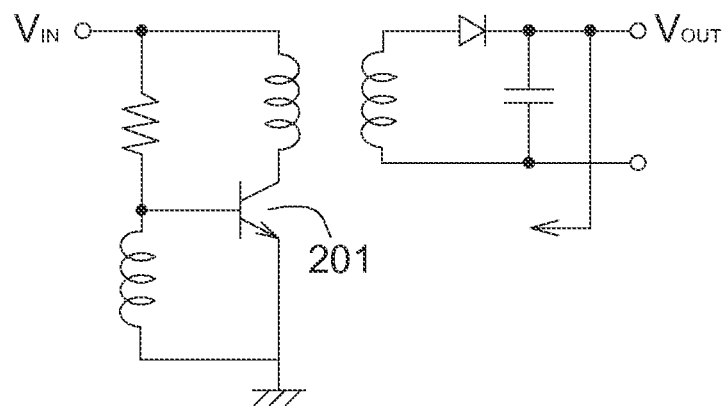
FIG. 10 illustrates a semiconductor circuit in one embodiment.
Figure 11:
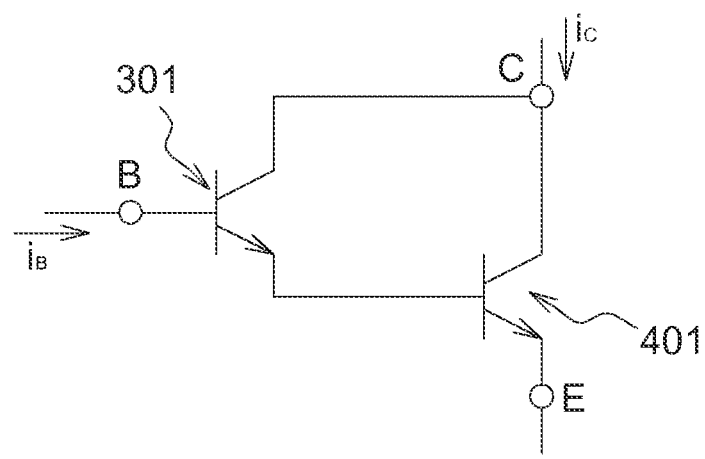
FIG. 11 illustrates a semiconductor circuit in one embodiment.

In embodiments, the bipolar junction transistor can be applied for various suitable semiconductor circuits such as a self excited DC/DC converter as shown in FIG. 10, or Darlington pair as shown in FIG. 11. Referring to FIG. 10, the bipolar junction transistor 201 used as a buffer in the DC/DC converter can be used to switch a high voltage to a low voltage ($V_{IN} > V_{OUT}$). Referring to FIG. 11, Darlington pair obtains an output current amplified by a multiple ratio of a product of β values of the two bipolar junction transistor 301, 401.

According to the disclosed embodiments, the buried layer of the bipolar junction transistor can be used for preventing vertical punch through. The distance between the emitter electrode and the collector electrode (or the collector region can be optimized for preventing lateral punch through. The conductive layer can be used as a field plate for changing electric field distribution so as to increase breakdown voltage of the bipolar junction transistor. The bipolar junction transistor can be formed by using BCD process. Therefore, it helps to integrate various devices into a single chip and increase integration of a circuit. In addition, the cost and the processes for manufacture are reduced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A bipolar junction transistor, comprising:
   a well region;
   an emitter electrode;
   a base electrode;
   a collector electrode, wherein the emitter electrode, the base electrode and the collector electrode are separated from each other by the well region, the emitter electrode and the collector electrode have a first type conductivity, the base electrode has a second type conductivity opposite to the first type conductivity;
   a dielectric structure; and
   a conductive layer on the well region between the base electrode and the collector electrode, wherein the dielectric structure is between the conductive layer and the well region.

2. The bipolar junction transistor according to claim 1, wherein the conductive layer comprises a doped polysilicon, a metal silicide or a metal.

3. The bipolar junction transistor according to claim 1, wherein the well region comprises a first well portion and a second well portion adjacent to each other, the first well portion has the first type conductivity, the second well portion has the second type conductivity opposite to the first type conductivity.

4. The bipolar junction transistor according to claim 3, wherein the conductive layer is on the first well portion.

5. The bipolar junction transistor according to claim 4, wherein the conductive layer is on the second well portion.

6. The bipolar junction transistor according to claim 3, wherein the collector electrode is in the first well portion, the emitter electrode and the base electrode are in the second well portion.

7. The bipolar junction transistor according to claim 3, further comprising a substrate and a buried layer, wherein the first well portion is between the second well portion and the buried layer, the buried layer is between the substrate and the first well portion, the buried layer has the first type conductivity, the substrate has the second type conductivity.

8. The bipolar junction transistor according to claim 7, further comprising a doped layer having the second type conductivity and between the buried layer and the first well portion.

9. A manufacturing method for a bipolar junction transistor, comprising:
   forming an emitter electrode, a base electrode and a collector electrode in a well region, wherein the emitter electrode, the base electrode and the collector electrode are separated from each other by the well region, the emitter electrode and the collector electrode have a first type conductivity the base electrode has a second type conductivity opposite to the first type conductivity;
   forming a dielectric structure on the well region; and
   forming a conductive layer on the well region between the base electrode and the collector electrode, wherein the dielectric structure is between the conductive layer and the well region.

10. The manufacturing method for the bipolar junction transistor according to claim 9, wherein the conductive layer comprises a doped polysilicon, a metal silicide or a metal.

11. The manufacturing method for the bipolar junction transistor according to claim 9, wherein the well region comprises a first well portion and a second well portion adjacent to each other, the first well portion has the first type conductivity, the second well portion has the second type conductivity opposite to the first type conductivity.

12. The manufacturing method for the bipolar junction transistor according to claim 11, wherein the conductive layer is formed on the first well portion.

13. The manufacturing method for the bipolar junction transistor according to claim 12, wherein the conductive layer is formed on the second well portion.

14. The manufacturing method for the bipolar junction transistor according to claim 11, wherein the collector electrode is formed in the first well portion, the emitter electrode and the base electrode are formed in the second well portion.

15. The manufacturing method for the bipolar junction transistor according to claim 11, further comprising forming a buried layer on a substrate, wherein the first well portion is between the second well portion and the buried layer, the buried layer is between the substrate and the first well portion, the buried layer has the first type conductivity, the substrate has the second type conductivity.

16. The manufacturing method for the bipolar junction transistor according to claim 15, further comprising forming a doped layer on the buried layer, wherein the doped layer has the second type conductivity and is between the buried layer and the first well portion.

* * * * *